(12) United States Patent
Feng

(10) Patent No.: US 7,250,778 B2
(45) Date of Patent: Jul. 31, 2007

(54) WAFER TEST APPARATUS INCLUDING OPTICAL ELEMENTS AND METHOD OF USING THE TEST APPARATUS

(75) Inventor: Kai Di Feng, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 11/006,184

(22) Filed: Dec. 7, 2004

(65) Prior Publication Data

US 2005/0103984 A1   May 19, 2005

Related U.S. Application Data

(62) Division of application No. 10/791,067, filed on Mar. 2, 2004, now Pat. No. 7,012,440, which is a division of application No. 09/682,287, filed on Aug. 14, 2001, now Pat. No. 6,731,122.

(51) Int. Cl.
G01R 31/302 (2006.01)
G01R 31/28 (2006.01)

(52) U.S. Cl. .................. 324/752; 324/765; 438/16

(58) Field of Classification Search .............. None
See application file for complete search history.

(56) References Cited

U.S. PATENT DOCUMENTS 2,081,839 A * 5/1937 Rankin ............... 324/96
4,775,640 A 10/1988 Chan
5,101,453 A 3/1992 Rumbaugh
5,177,351 A 1/1993 Lagowski
5,477,158 A 12/1995 Shafer et al.
5,631,571 A 5/1997 Spaziani et al.
6,057,918 A 5/2000 Geary et al.
6,058,497 A 5/2000 Tuttle
6,119,255 A 9/2000 Akram
6,300,785 B1 10/2001 Cook et al.
6,331,782 B1 12/2001 White et al.

FOREIGN PATENT DOCUMENTS

| JP | 56114348 | 9/1981 |
|----|----------|--------|
| JP | 59178742 | 10/1984 |
| JP | 60025244 | 2/1985 |
| JP | 62031136 | 2/1987 |
| JP | 2010848  | 1/1990 |

* cited by examiner

*Primary Examiner*—Ernest Karlsen
(74) *Attorney, Agent, or Firm*—Michael Le Strange; Dugan & Dugan PC

(57) ABSTRACT

Wafer-level testing is performed on an electronic device to be used in an optical communications system. An optical test signal is generated and is provided to a first photo detector. An electrical output of the first photo detector is supplied to the electronic device on the wafer. An electrical output from the electronic device on the wafer is used to drive a light source. An optical output of the light source is supplied to a second photo detector and an electrical signal output from the second photo detector is examined.

20 Claims, 4 Drawing Sheets

WAFER TEST APPARATUS INCLUDING OPTICAL ELEMENTS AND METHOD OF USING THE TEST APPARATUS

This application is a division of U.S. patent application Ser. No. 10/791,067, filed Mar. 2, 2004, now U.S. Pat. No. 7,012,440 which is a division of U.S. patent application Ser. No. 09/682,287, filed Aug. 14, 2001 (now U.S. Pat. No. 6,731,122). Both of these patent applications are hereby incorporated by reference herein in their entirety.

FIELD OF THE INVENTION

The present invention is concerned with testing wafers on which electronic circuits are formed, and is more particularly concerned with testing electronic circuits used in optical communications systems.

BACKGROUND OF THE INVENTION

It is well known to apply tests to electronic circuits formed on semiconductor wafers. A purpose of such testing is to determine whether the electronic circuits had been properly manufactured to perform their desired functions.

Some types of integrated circuits (ICs) are manufactured for use in optical communications systems.

FIG. 1 is a schematic illustration of a conventional arrangement in which an electronic IC 10 is utilized in an optical communications system. The electronic IC 10 is coupled between a photo detector 12 which provides an electrical input signal for the electronic IC 10, and a light source 14 which is driven by an electrical signal from the electronic IC 10. The electronic IC 10 has receiver functions that respond to the electrical input signal from the photo detector 12, and transmitter functions that produce the electrical signal which drives the light source 14. The photo detector 12 may be a PIN diode or an avalanche photo detector (APD). The light source 14 may be an LED (light emitting diode) or a laser.

Typically electronic ICs manufactured for optical communications are not produced on the same wafer with optical elements because different manufacturing processes are required for the electronic circuits and the optical elements. Instead, after testing, each die containing an electronic IC is cut from its wafer and then packaged with associated optical elements.

According to conventional practices, during testing of the electronic IC die on a wafer, the photo detector with which the IC is to be packaged is simulated by using a current source in parallel with a capacitor. A resistor is conventionally used to simulate the light source that the electronic IC is intended to drive.

However, there are significant differences in performance between the actual optical elements and the circuit elements conventionally used to simulate them during wafer testing. As a result, tests that would be desirable to perform on a wafer cannot be carried out. For example, the frequency performance of a PIN diode is dependent on the incident optical power. When the incident optical power is at a high level, the bandwidth of the PIN diode is reduced. Conventional electronic circuits used in optical communications systems include a function to compensate for the drop in bandwidth at high optical power. This function is very important to insure that the optical communications system operates in accordance with specifications in a high optical power environment, and consequently, the function should be tested at the wafer level. However, this function is not tested on the wafer because the mechanism of the bandwidth reduction of the PIN diode at high incident optical power is quite complex and cannot be simulated by a simple change of parallel capacitance.

The limitations on wafer testing of electronic ICs for optical communications systems, due to the inexact simulation of optical elements, may lead to the following problems. First, some bad dies may be passed through wafer testing, only to be found in package level tests. The cost of inking out a bad die is relatively low, on the order of several tens of cents, but after a die is packaged and found to be bad, the cost is on the order of several dollars at least. Consequently passing a bad die through wafer testing may cause a ten-fold increase in expense due to the original manufacturing failure relative to the bad die.

Secondly, when package level testing indicates a fault in a package, it can be difficult to determine whether the fault is due to the electronics IC (i.e., a bad die) or problems with the optical components. Consequently, it may be necessary to undertake an expensive debugging procedure which entails a significant amount of engineering time to determine the cause of the failure. It accordingly would be very desirable to weed out all bad dies at the wafer test level. However, this is not feasible with conventional wafer testing procedures and wafer testing apparatus used in connection with electronic ICs for optical communications systems.

It accordingly would be desirable to improve the capabilities of wafer test equipment used in regard to electronic ICs for optical communications systems with respect to representation of optical components.

It would also be desirable that the test apparatus components which represent optics be capable providing a very wide range of signal power. This is because, especially in the case of "open space" optical communications devices (i.e., devices in which no optical wave guide is employed), the incident optical power to a photo detector may vary over up to 6 orders of magnitude as the communication distance varies.

It would also be desirable that the test apparatus not provide false indications of die failures due to aging of components of the test apparatus.

SUMMARY OF THE INVENTION

According to a first aspect of the invention, a method of testing an electronic device on a wafer is provided. The method includes generating an optical test signal, providing the optical test signal to a first photo detector, and supplying an electrical output of the first photo detector to the electronic device on the wafer.

According to a second aspect of the invention, a method of testing an electronic device on a wafer includes driving a light source with an electrical output from the electronic device on the wafer, supplying an optical output of the light source to a second photo detector, and examining an electrical signal output from the second photo detector.

The optical test signal may be provided to the first photo detector via a first variable optical attenuator and the optical output of the light source may be supplied to the second photo detector via a second variable optical attenuator.

According to a third aspect of the invention, an apparatus for testing an electronic device on a wafer includes the following elements:

(a) a first light source for generating an optical test signal in accordance with a test control signal;

(b) a first variable optical attenuator coupled to the first light source for receiving and attenuating the optical test signal to produce an attenuated optical test signal;

(c) a first photo detector coupled to the first variable optical attenuator for receiving the attenuated optical test signal and converting the attenuated optical test signal into an electrical test signal;

(d) first probes for selectively coupling the electrical test signal to the electronic device on the wafer;

(e) a second light source;

(f) a second probe for receiving an electrical output from the electronic device on the wafer and selectively coupling the electrical output from the electronic device on the wafer to drive the second light source to output an optical output signal;

(g) a second variable optical attenuator coupled to the second light source for receiving and attenuating the optical output signal to produce an attenuated optical output signal;

(h) a second photo detector coupled to the second optical attenuator for receiving the attenuated optical output signal and converting the attenuated optical output signal into an electrical detection signal; and (i) a first monitoring circuit coupled to the second photo detector for receiving and monitoring the electrical detection signal.

With the methods and apparatus of the present invention, a more complete set of wafer-level tests may be performed on electronic circuits to be used in optical communications systems. Consequently defects in the electronic circuitry can be reliably detected prior to packaging, so that costs of manufacturing failures and debugging time are reduced.

Other objects, features and advantages of the present invention will become more fully apparent from the following detailed description of the preferred embodiments, the appended claims and the accompanying drawings.

DETAILED DESCRIPTION OF EXEMPLARY EMBODIMENTS

Exemplary embodiments of the invention will now be described, initially with reference with FIGS. 2A and 2B.

Figure 1:
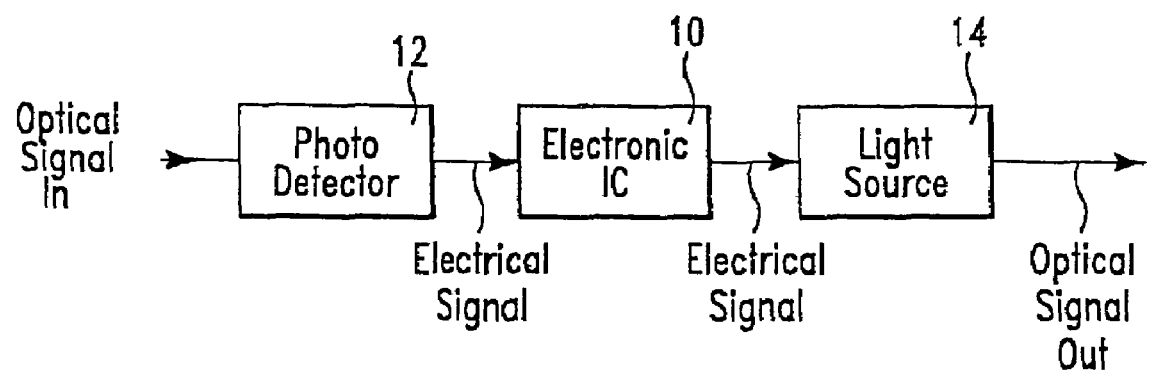
FIG. 1 is a block diagram representation of a portion of a conventional optical communications system.
Figure 2A:
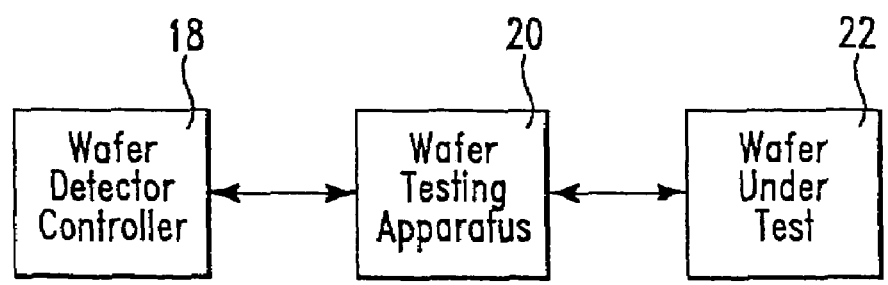
FIG. 2A is a high level block diagram of a wafer testing apparatus provided in accordance with the invention.

FIG. 2A is a high-level block diagram showing a wafer under test 22 coupled to exchange electrical signals with a testing apparatus 20. Testing apparatus 20 is coupled to a wafer tester controller 18 to receive testing control signals from the wafer tester controller 18 and to provide test result signals (e.g. monitoring signals) to the wafer tester controller 18. The wafer tester controller 18 may comprise, for example, one or more appropriately programmed microprocessors or some other suitable combination of hardware and/or software.

Figure 2B:
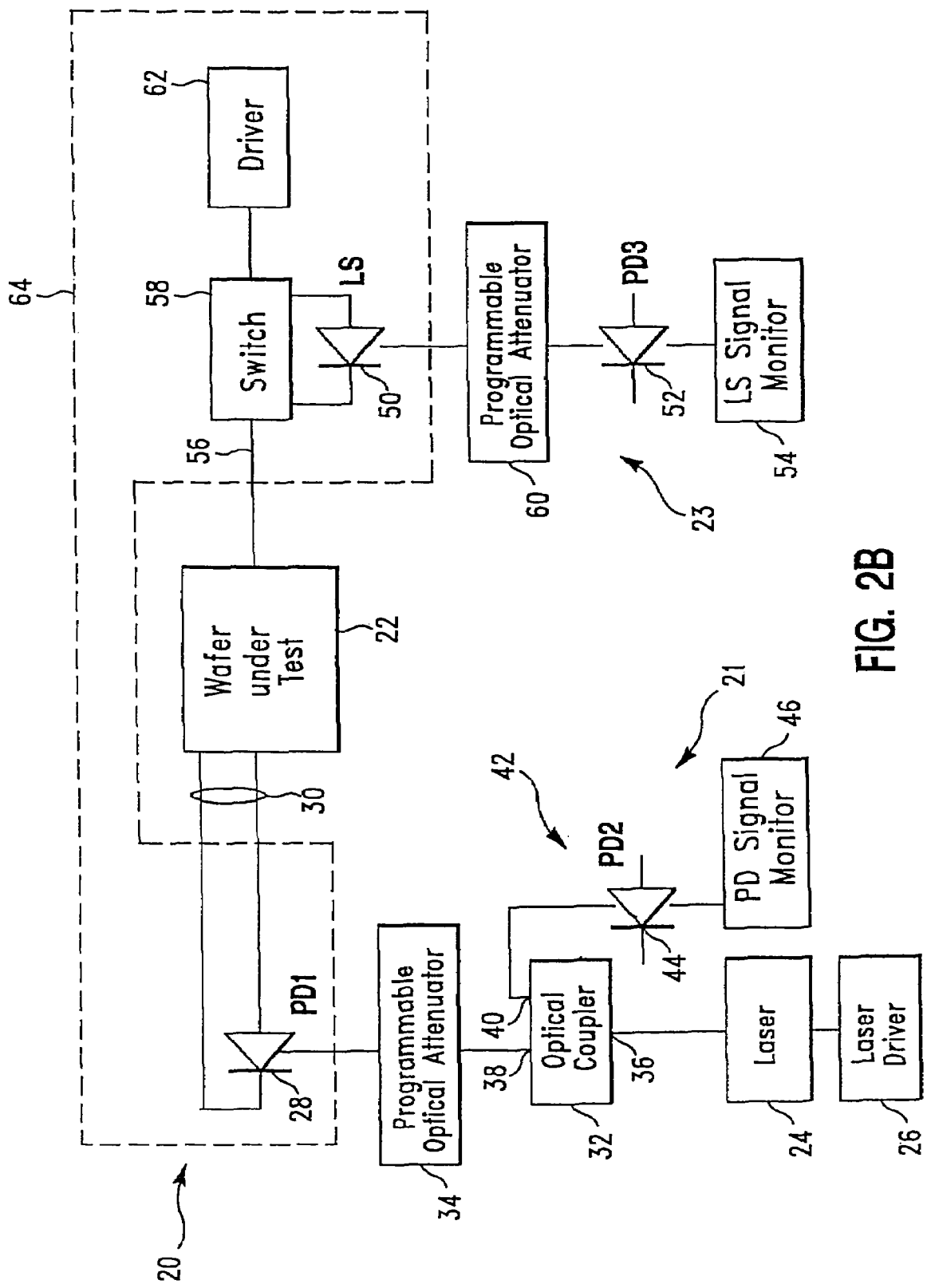
FIG. 2B is a block diagram that illustrates an exemplary embodiment of the wafer testing apparatus of FIG. 2A.

FIG. 2B is a more detailed block diagram showing an embodiment of testing apparatus 20 provided in accordance with the invention. The testing apparatus 20 may be implemented, for example, as part of a wafer test probe station and includes optical components. Reference numeral 22 again indicates the wafer under test. The wafer under test 22 may be a conventional semiconductor wafer carrying numerous electronic ICs suitable for packaging and use with optical components of an optical communications system.

The testing apparatus 20 includes a photo detector side 21 and a light source side 23. The photo detector side 21 of the testing apparatus 20 is provided to represent a photo detector with which a die under test is intended to be used when installed in an optical communication system. The light source side 23 of the testing apparatus 20 is provided to represent a light source to be driven by the die under test. As will be discussed below, the photo detector side 21 is useful for testing receiver functions of the die under test, and the light source side 23 is useful for testing transmitter functions of the die under test.

The photo detector side 21 of the testing apparatus 20 includes a laser 24. The laser 24 may be, for example, of a type that is suitable to provide a light source for an optical fiber, and having an optical output of the type used in the optical communications system with which the dies under test are to be used. The output optical power of the laser 24 is preferably at least 1.5 times the maximum incident intensity required for the downstream photo detector 28, which will be discussed below. The purpose of the optical power margin is to allow for insertion loss in optical couplers and other optical devices included in the photo detector side 21 of the testing apparatus 20.

The photo detector side 21 of the testing apparatus 20 also includes a laser driving circuit 26. The laser driver circuit 26 is arranged to generate a suitable electric signal to drive the laser 24 to produce an optical test signal with necessary amplitude, pulse width, rise time and fall time characteristics, in case electronic IC dies for optical digital communication are being tested, or with suitable amplitude and frequency characteristics if electronic IC dies for optical analog communication are being tested. Further details of the driving arrangement of the laser 24 will be described below.

The photo detector side 21 of the testing apparatus 20 also includes a first photo detector 28. Preferably the first photo detector 28 is of the same type as the photo detector(s) with which the electronic ICs under test are to be used. Consequently, the first photo detector 28 may be, for example, a PIN diode or an avalanche photo diode (APD) suitable for use with an optical fiber. The first photo detector 28 preferably is pre-measured to ensure that it satisfies the standard parameters for a photo detector of its type. Such parameters may include sensitivity, bandwidth, parasitic capacitance, and parasitic resistance. First probes 30 are connected to the cathode and anode of the first photo detector 28 to allow electrical current signals output from the first photo detector 28 to be selectively coupled to the electronic IC die under test.

In at least one embodiment, the optical test signal output from the laser 24 is coupled to the first photo detector 28 via an optical coupler 32 and a programmable variable optical attenuator 34. The laser 24 and the photo detector 28 may be otherwise coupled (e.g., via a waveguide, atmosphere or some other optical communications channel as long as the incident optical power to the photo detector can be controlled and light source output power stability can be monitored). As used herein, a light source and a detector are "coupled" when the detector is configured to receive light from the light source.

In the embodiment of FIG. 2B, the optical coupler 32 is a three terminal fiber optic device having an input terminal 36 and output terminals 38 and 40. The input terminal 36 of the optical coupler 32 is coupled to receive the optical test signal output from the laser 24. The optical coupler 32 provides the input optical test signal to its output terminals 38, 40 with certain respective coupling ratios. For example, the coupling ratio from the input terminal 36 to the output terminal 38 may be 0.99, and the coupling ratio from the input terminal 36 to the output terminal 40 may be 0.01. Other coupling ratios may be employed. The output terminal 38 of the optical coupler 32 is coupled to an input of the variable optical attenuator 34. The output terminal 40 of the optical coupler 32 is coupled to provide an attenuated portion of the optical test signal of the laser 24 to a laser monitoring branch 42 of the photo detector side 21 of the testing apparatus 20. Details of the laser monitoring branch 42 will be discussed below.

As stated above, the variable optical attenuator 34 is coupled to receive the slightly attenuated optical test signal from the laser 24 via the optical coupler 32. The variable optical attenuator 34 preferably operates under control of a signal provided by wafer tester controller 18 (FIG. 2A) to provide a range of insertion loss (e.g., 60 dB or more). Accordingly, the variable optical attenuator 34 may simulate the input dynamic range of most optical communications systems.

The laser monitoring branch 42 of the photo detector side 21 of the testing apparatus 20 includes a monitor photo detector 44 and a photo detector side signal monitoring circuit 46. The monitor photo detector 44 may be any suitable photo detecting device for receiving and converting to an electrical signal the optical signal which is output from the laser 24 and coupled with attenuation by the optical coupler 32 to the monitor photo detector 44. For example, the monitor photo detector 44 may be a high speed photo detector, a PIN diode or an APD. The photo detector side signal monitoring circuit 46 is coupled to receive the electrical signal output from the photo detector 44. The photo detector side signal monitoring circuit 46 may be arranged to measure, for example, the following parameters of the optical signal output by the laser 24: (1) in the case of testing electronic IC dies for optical digital communications systems, the amplitude, rise time, fall time and pulse width; and (2) in the case of testing electronic IC dies for use in optical analog communications systems, the amplitude and frequency. Further details of possible arrangements for the signal monitoring circuit 46 will be described below.

In one embodiment of the invention, when it is found that the output signal from the laser 24 fails to comply with predetermined limits (e.g., amplitude, rise time, fall time, pulse width, frequency, etc.), the signal monitoring circuit 46 sends a signal to the wafer tester controller 18 (FIG. 2A). The wafer tester controller 18 may then take appropriate action such as changing the degree of attenuation provided by variable optical attenuator 34, adjusting the drive signal output by the laser driver 26, or sending a notice to the testing apparatus operator to advise that the laser 24 is in need of replacement. Accordingly, the laser monitoring branch 42 is able to monitor variations in output of the laser 24 to correct aging of the laser 24 or other conditions that may cause the photo detector side 21 of the testing apparatus 20 to fail to provide reliable test signal input to the wafer under test 22.

Details of the light source side 23 of the testing apparatus 20 will now be described.

The light source side 23 of testing apparatus 20 includes a light source 50, a third photo detector 52, and a light source side signal monitoring circuit 54. The light source 50 is selectively couplable to a second probe 56 by a switch 58. The light source 50 is preferably a standard light source such as an LED or a laser (e.g., an OL399N-150F/P20 manufactured by OKI Semiconductor). The light source 50 preferably is pre-measured to ensure it satisfies the standard parameters for a light source of its type.

Light source 50 receives via second probe 56 and switch 58 a light source driving signal output from the electronic IC die under test and converts the driving signal from the electronic IC die under test into an optical output. The optical output from the light source 50 is coupled to the third photo detector 52 by way of a second programmable variable optical attenuator 60. The variable optical attenuator 60 preferably provides suitable attenuation of the optical signal output from the light source 50 so that the incident optical power applied to the third photo detector 52 is set to a proper level for normal operation of the third photo detector 52 (e.g., a level that does not saturate the third photo detector 52). For example, the third photo detector 52 may be a high speed photo detector, a PIN diode or an APD. The third photo detector 52 converts the optical signal applied thereto into an electrical signal, which is coupled to the light source side monitoring circuit 54.

The light source side signal monitoring circuit 54 is arranged to measure the parameters of the optical signal supplied to the third photo detector 52. Since the light source 50 is known to have standard output characteristics, the measurements provided by the light source side signal monitoring circuit 54 are indicative of the performance of a light source driver component of the electronic IC die under test.

A standard light source driver 62 is included in the light source side 23 of the testing apparatus 20. The light source driver 62 is selectively couplable via switch 58 to the light source 50 to exercise the light source 50 so that it may be determined whether, due to aging or other circumstances, the light source 50 has departed from standard performance characteristics. The exercising of the light source 50 may be performed, for example, as part of an initialization procedure for the testing apparatus 20, periodically or the like.

In at least one embodiment, the first photo detector 28, the light source 50, the light source driver 62 and the switch 58 are located on a wafer test probe card, which is indicated by dashed outline 64. The other components of the testing apparatus 20 illustrated in FIG. 2B may be provided in a controller cabinet, and suitable connections to the first photo detector 28 and the light source 50 may be made via optical fiber patch cords. This arrangement of limiting the number of devices on the wafer test probe card 64 is desirable because the wafer test probe card 64 is typically a high density PCB (printed circuit board) on which space is limited.

Figure 3A:
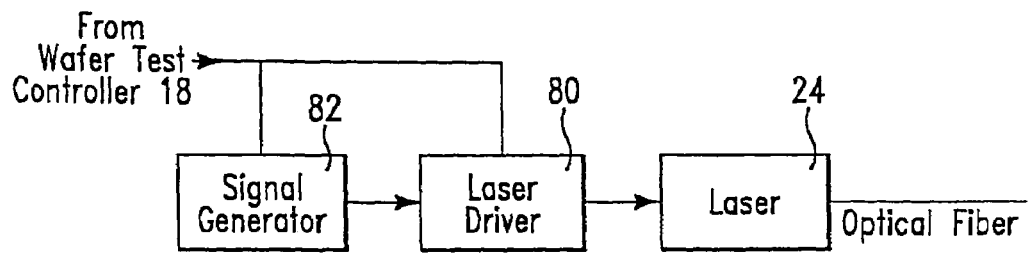
FIGS. 3A-C are block diagrams that illustrate arrangements for driving a laser that is part of the testing arrangement of FIG. 2B in accordance with respective embodiments of the invention.

Alternative embodiments of arrangements for driving the laser 24 (e.g., alternative embodiments of the laser driver 26) of the photo detector side 21 of testing apparatus 20 will now be described with reference to FIGS. 3A-C. In the embodiment shown in FIG. 3A the laser 24 is driven by a commercially available laser driving circuit 80 (such as a MAX3867 manufactured by MAXIM). The laser driving circuit 80 operates under control of a signal output from a signal generator 82. The signal generator 82 is controlled, in turn, by command messages from the wafer tester controller 18 (FIG. 2A). The laser driving embodiment of FIG. 3A is easy to implement since it utilizes a standard, commercially-available laser driving circuit 80.

Figure 3B:
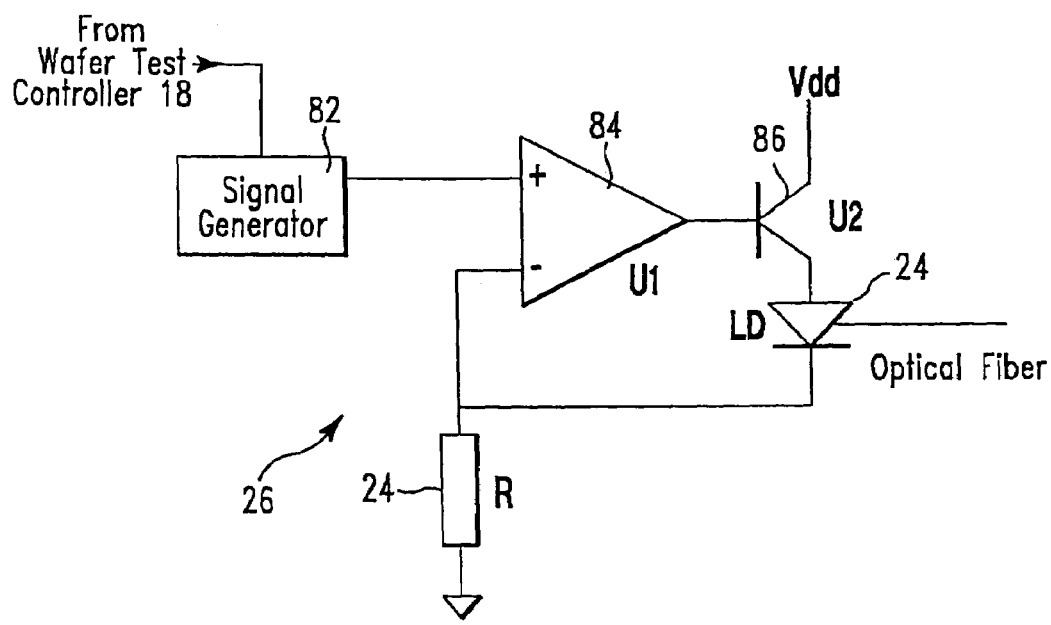
Figure 3C:
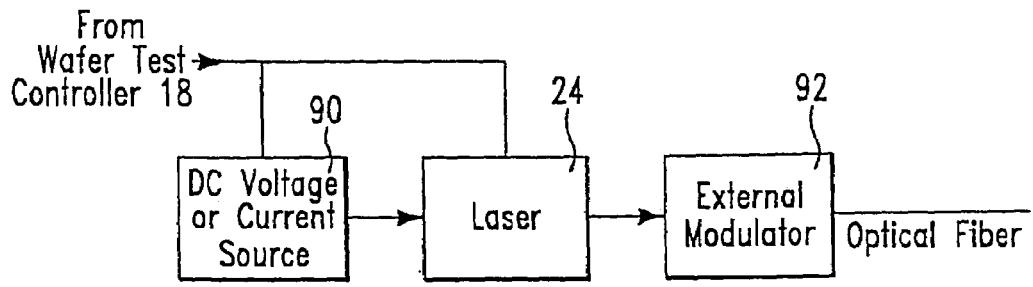

A second, lower-cost embodiment of a laser driving arrangement is shown in FIG. 3B. The arrangement of FIG. 3B includes the signal generator 82 of FIG. 3A, as well as an operational amplifier 84, a power transistor 86 and a current sample resistor 88. A voltage signal from the signal generator 82 is applied to the non-inverting input of the operational amplifier 84. The output of the operational amplifier 84 is coupled to the base of the power transistor 86. The current sample resistor 88 is connected between the inverting input of the operational amplifier 84 and ground. A laser diode 24 is connected between the emitter of the power transistor 86 and the inverting input of the operational amplifier 84.

The voltage across the resistor 88 is dependent on the current through the resistor 88. The feedback signal to the inverting input of the operational amplifier 84 forces the current waveform through the laser diode 24 to follow the input signal provided to the non-inverting input of the operational amplifier 84. Consequently, the input signal controls the waveform of the optical output of the laser diode 24.

The laser driving arrangement of FIG. 3B is suitable for representing an optical system that operates at frequencies of up to about 2.5 Gigahertz. To represent a higher speed system, such as a 10 GHz system, an arrangement such as that shown in FIG. 3C may be employed. In the arrangement of FIG. 3C, a DC source 90 drives the laser 24 with a constant voltage or constant current so that the laser 24 outputs a maximum constant optical power. An external optical modulator 92 (e.g., a 40 Gbits/s Lithium Niobate Electro-optic Modulator manufactured by Agere Systems) operates under control from the wafer tester controller 18 (FIG. 2A) to modulate the constant optical signal output from the laser 24.

Figure 4A:
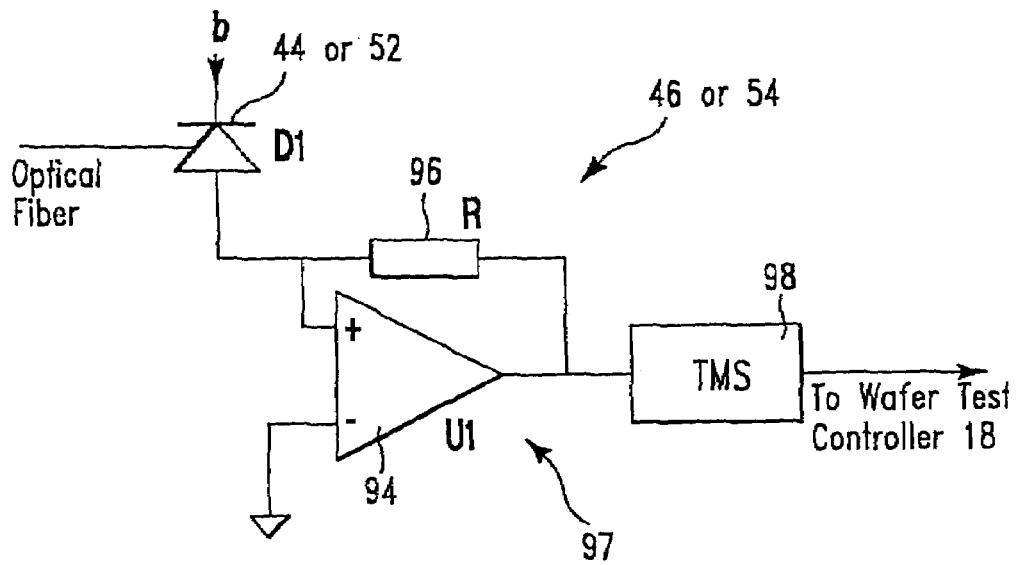
FIGS. 4A and 4B are block diagrams that illustrate signal monitoring arrangements that may be included in the testing apparatus of FIG. 2B in accordance with respective embodiments of the invention.
Figure 4B:
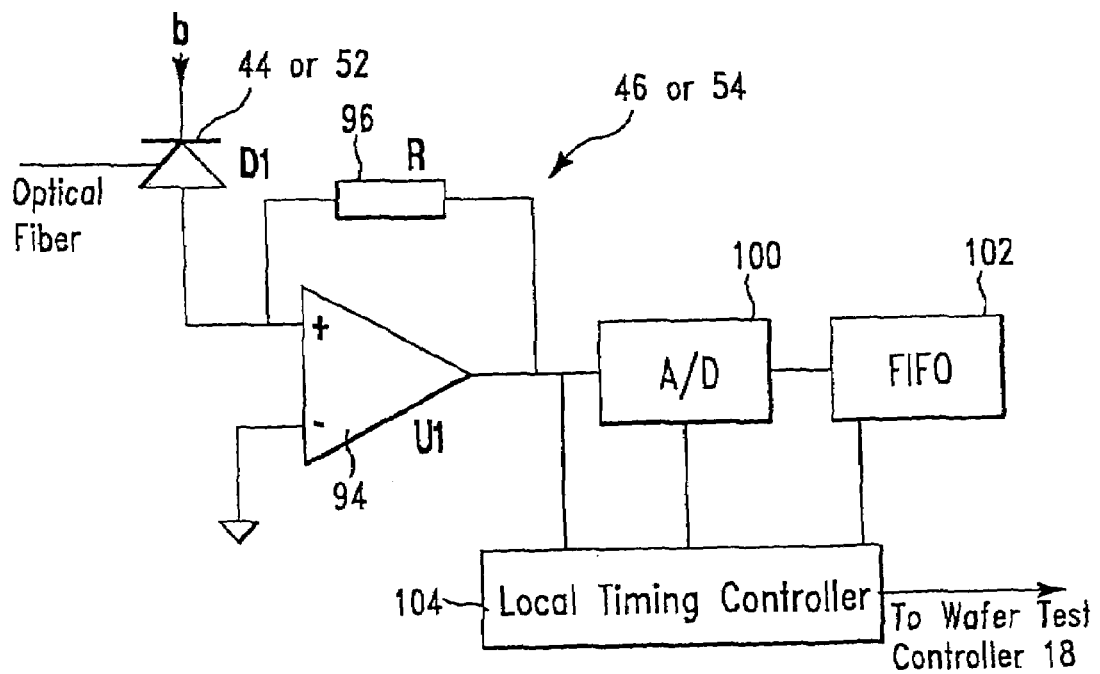

Alternative embodiments for arrangements of either or both of the photo detector side signal monitoring circuit 46 and the light source side signal monitoring circuit 54 of FIG. 2B are illustrated in FIGS. 4A and 4B. In both FIGS. 4A and 4B the photo detector 44 or 52 converts an optical signal applied thereto into an electrical current signal. Operational amplifier 94 and resistor 96 together form a transimpedance amplifier 97 which converts the electrical current signal output from the photo detector 44 or 52 into an electrical voltage signal. In FIG. 4A a commercially available time measurement system (TMS) 98 (such as a Catalyst manufactured by Teradyne) is provided to measure parameters including amplitude of the voltage signal output from the transimpedance amplifier 97 and to provide the resulting data to the wafer tester controller 18 (FIG. 2A).

In the arrangement of FIG. 4B the voltage signal output from the transimpedance amplifier 97 is provided to an onboard circuit that includes a high speed analog-to-digital (A/D) converter 100 (e.g., a 12 bit, 100 MSPS A/D converter such as an ADS810 manufactured by Burr-brown), a high-speed first-in-first-out (FIFO) memory 102 (e.g., an IDT72V821L_10 manufactured by Integrated Device) and a local timing controller 104. The local timing controller 104 may include a micro controller such as a Motorola 68000 plus a high frequency oscillator with a frequency matching the FIFO memory 102.

The local timing controller 104 generates all of the timing signals required to trigger sampling by the A/D converter 100 and to control read and write operations of the FIFO memory 102. The data samples output from the A/D converter 100 are temporarily stored in the FIFO memory 102 and then are sent to the wafer tester controller 18 under the control of the local timing controller 104. The wafer tester controller 18 can then analyze the sampled data and obtain information concerning the optical waveform that was applied to the photo detector 44 or 52, as the case may be.

In the event that the timing resolution of the A/D converter 100 is not sufficiently high, a timing interleaving technique may be used by means of the local timing controller 104.

Operation of the testing apparatus 20 will now be described with reference to FIG. 2B. To test an electronic IC die (not shown) under test on wafer 22 in a receiver mode, laser 24 is driven, under the control of the wafer tester controller 18 (FIG. 2A), to generate an optical test signal. For example, the wafer tester controller 18 may provide appropriate signals to the laser driver 26 (e.g., to the signal generator 82 and/or to the external modulator 92 of FIGS. 3A-C) so that the optical output of the laser 24 is modulated to produce the optical test signal. Exemplary optical test signals include a test pattern of "010101" to test the receiver frequency performance, or a pattern of "111111101" to test receiver response to a duty cycle change of a received signal. Other test signals may be similarly employed. The optical test signal is coupled to the first photo detector 28 by way of optical coupler 32 and variable optical attenuator 34. If appropriate, the power level of the optical test signal may be adjusted at the variable optical attenuator 34 under the control of the wafer tester controller 18. The optical test signal provided to the first photo detector 28 is converted by the first photo detector 28 to an electrical output which is supplied via probes 30 to the die under test.

As noted before, the first photo detector 28 preferably is matched to the type of photo detector with which the electronic circuit under test is designed to operate. Furthermore, the variable optical attenuator 34 may be controlled to provide a wide range of attenuation of the optical test signal to simulate the wide input power range that may be experienced by the electronic circuit under test in its operating environment. Also, the performance of the laser 24 may be tracked through operation of the laser monitoring branch 42 of the photo detector side 21 of the testing apparatus 20 on appropriate occasions, to ensure that the laser 24 meets predetermined standard operating parameters.

As a result of these factors, the photo detector side 21 of the testing apparatus 20 provides a highly realistic representation of the input side of the environment in which the electronic circuit under test is intended to operate.

Operation of the light source side 23 of the testing apparatus 20 to test a transmitter mode of a die under test will now be described. A light source driving signal output from the die under test on wafer 22 is coupled via the probe 56 and the switch 58 to the light source 50. The light source 50 converts the driving signal to an optical output. The optical output of the light source 50 is coupled via variable optical attenuator 60 to the third photo detector 52. The third photo detector 52 converts the optical signal coupled thereto into an electrical signal, which is monitored by the light source side monitoring circuit 54 and analyzed by the wafer tester controller 18.

With the testing apparatus of the present invention, electronic circuits to be used in optical communications systems can be fully tested at the wafer level so that fewer bad dies pass the wafer level test. Consequently, the yield at package level testing is improved. Furthermore, since defects in the electronic IC dies may be detected during wafer level testing, failures detected at package level testing can be assumed to be due primarily to optical components in the package, and not due to the electronic ICs in the package. As a result, the range of searching to debug package level failures is reduced, with saving of engineering time and a reduction in expenses related to debugging.

The foregoing description discloses only the preferred embodiments of the invention; modifications of the above disclosed apparatus and method which fall within the scope of the invention will be readily apparent to those of ordinary skill in the art. For example, if only the receiver mode of an electronic IC die is to be tested, then the test procedures carried out by the light source side 23 of the testing apparatus 20 may be omitted. Similarly, if only the transmitter mode of an electronic IC die is to be tested, then the test procedures carried out by the photo detector side 21 of the testing apparatus 20 may be omitted. Receiver mode testing may be performed before, during or after transmitter mode testing.

Moreover, if electronic IC dies having only receiver capabilities are to be tested, then the light source side 23 may be omitted from the testing apparatus 20, and if electronic IC dies having only transmitting capabilities are to be tested, then the photo detector side 21 may be omitted from the testing apparatus 20.

Accordingly, while the present invention has been disclosed in connection with the preferred embodiments thereof, it should be understood that other embodiments may fall within the spirit and scope of the invention, as defined by the following claims.

The invention claimed is:

1. Apparatus adapted to test an electronic device on a wafer, comprising:
   a light source adapted to generate an optical test signal in accordance with a test control signal;
   a photo detector coupled to the light source and adapted to receive the optical test signal and convert the optical test signal into an electrical test signal; and
   probes connected to the photo detector and adapted to selectively couple the electrical test signal to the electronic device on the wafer.

2. The apparatus of claim 1, further comprising a variable optical attenuator coupling the light source to the photo detector.

3. The apparatus of claim 1, further comprising a monitoring circuit coupled to the light source and adapted to monitor at least one parameter of the optical test signal.

4. Apparatus adapted to test an electronic device on a wafer comprising:
   a probe adapted to receive an electrical driving signal output from the electronic device on the wafer;
   a light source coupled to the probe and adapted to receive the electrical driving signal and to be driven to output an optical signal;
   a photo detector coupled to the light source and adapted to receive the optical signal and convert the optical signal to an electrical detection signal; and
   a monitoring circuit coupled to the photo detector and adapted to receive and monitor the electrical detection signal.

5. The apparatus of claim 4, further comprising a variable optical attenuator coupling the light source to the photo detector.

6. The apparatus of claim 4, further comprising:
   a driving circuit; and
   a switch adapted to selectively couple the driving circuit to the light source.

7. Apparatus adapted to test an electrical device on a wafer, comprising:
   a first light source adapted to generate an optical test signal in accordance with a test control signal;
   a first variable optical attenuator coupled to the first light source and adapted to receive and attenuate the optical test signal to produce an attenuated optical test signal;
   a first photo detector coupled to the first variable optical attenuator and adapted to receive the attenuated optical test signal and convert the attenuated optical test signal into an electrical test signal;
   first probes connected to the first photo detector and adapted to selectively couple the electrical test signal to the electronic device on the wafer;
   a second-light source;
   a second probe adapted to receive an electrical output from the electronic device on the wafer and selectively couple the electrical output from the electronic device on the wafer to drive the second light source to output an optical output signal;
   a second variable optical attenuator coupled to the second light source and adapted to receive and attenuate the optical output signal to produce an attenuated optical output signal;
   a second photo detector coupled to the second optical attenuator and adapted to receive the attenuated optical output signal and convert the attenuated optical output signal into an electrical detection signal; and
   a first monitoring circuit coupled to the second photo detector and adapted to receive and monitor the electrical detection signal.

8. The apparatus of claim 7 further comprising:
   a three-terminal optical coupler having an input terminal coupled to the first light source, a first output terminal coupled to the first variable optical attenuator, and a second output terminal;
   a third photo detector, coupled to the second output terminal of the three-terminal optical coupler, the third photo detector adapted to receive a portion of the optical test signal generated by the first light source and to convert said portion of the optical test signal into an electrical monitoring signal; and
   a second monitoring circuit coupled to the third photo detector and adapted to receive and monitor the electrical monitoring signal.

9. The apparatus of claim 8, further comprising:
   a light source driver;
   a switch connected to the second light source and adapted to couple the second light source to a selected one of the second probe and the light source driver.

10. The apparatus of claim 9, further comprising a wafer test probe card on which the first photo detector, the switch, the light source driver and the second light source are mounted.

11. The apparatus of claim 10, wherein the first light source, the first variable optical attenuator, the second variable optical attenuator, the second photo detector, the first monitoring circuit, the three-terminal optical coupler, the third photo detector and the second monitoring circuit are not mounted on the wafer test probe card.

12. The apparatus of claim 7, wherein the first light source includes a laser, and further comprising a driving circuit adapted to drive the laser.

13. The apparatus of claim 12, wherein the driving circuit receives the test control signal and drives the laser in accordance with the test control signal.

14. The apparatus of claim 13, wherein the driving circuit includes:
- an operational amplifier that receives the test control signal at a non-inverting input of the operational amplifier;
- a power transistor having its base connected to an output of the operational amplifier; and
- a resistor connected between ground and an inverting input of the operational amplifier;
- wherein the laser is a laser diode connected between an emitter of the power transistor and the inverting input of the operational amplifier.

15. The apparatus of claim 12, wherein the driving circuit drives the laser to output a constant amplitude optical signal, and further comprising an optical modulator adapted to receive the test control signal and modulate the constant amplitude optical signal in accordance with the received test control signal.

16. The apparatus of claim 7, wherein the electrical detection signal is a current signal and the first monitoring circuit includes:
- a transimpedance amplifier adapted to convert the current signal to a voltage signal; and
- a time measurement system adapted to measure parameters of the voltage signal.

17. The apparatus of claim 7, wherein the electrical detection signal is a current signal and the first monitoring circuit includes:
- a transimpedance amplifier adapted to convert the current signal to a voltage signal;
- an analog-to-digital (A/D) converter adapted to convert the voltage signal to digital data;
- a first-in-first-out (FIFO) memory adapted to store the digital data; and
- a timing controller adapted to provide timing signals to the A/D converter and the FIFO memory.

18. The apparatus of claim 7, wherein the first photo detector is selected from the group consisting of a PIN diode and an avalanche photo diode (APD).

19. The apparatus of claim 7, wherein the second photo detector is selected from the group consisting of a high speed photo diode, a PIN diode and an APD.

20. Apparatus for testing an electrical device on a wafer, comprising:
- a first light source for generating an optical test signal in accordance with a test control signal;
- a first variable optical attenuator coupled to the first light source for receiving and attenuating the optical test signal to produce an attenuated optical test signal;
- a first photo detector coupled to the first variable optical attenuator for receiving the attenuated optical test signal and converting the attenuated optical test signal into an electrical test signal;
- first probes connected to the first photo detector for selectively coupling the electrical test signal to the electronic device on the wafer;
- a second light source;
- a second probe for receiving an electrical output from the electronic device on the wafer and selectively coupling the electrical output from the electronic device on the wafer to drive the second light source to output an optical output signal;
- a second variable optical attenuator coupled to the second light source for receiving and attenuating the optical output signal to produce an attenuated optical output signal;
- a second photo detector coupled to the second optical attenuator for receiving the attenuated optical output signal and converting the attenuated optical output signal into an electrical detection signal; and
- a first monitoring circuit coupled to the second photo detector for receiving and monitoring the electrical detection signal.

* * * * *